United States Patent
Potter et al.

(10) Patent No.: US 11,342,210 B2
(45) Date of Patent: May 24, 2022

(54) METHOD AND APPARATUS FOR MEASURING WAFER MOVEMENT AND PLACEMENT USING VIBRATION DATA

(71) Applicant: Applied Materials, Inc., Santa Clara, CA (US)

(72) Inventors: Charles G. Potter, Santa Clara, CA (US); Terrance Allen Neal, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 349 days.

(21) Appl. No.: 16/545,814

(22) Filed: Aug. 20, 2019

(65) Prior Publication Data

US 2020/0075369 A1 Mar. 5, 2020

Related U.S. Application Data

(60) Provisional application No. 62/726,874, filed on Sep. 4, 2018.

(51) Int. Cl.
*H01L 21/67* (2006.01)
*G01D 5/24* (2006.01)
(Continued)

(52) U.S. Cl.
CPC ......... *H01L 21/67259* (2013.01); *G01D 5/24* (2013.01); *G01H 1/00* (2013.01); *H01L 21/68742* (2013.01)

(58) Field of Classification Search
CPC ......... H01L 21/67259; H01L 21/68742; H01L 21/67288; H01L 22/34; H01L 22/26;
(Continued)

(56) References Cited

U.S. PATENT DOCUMENTS 6,499,367 B1 12/2002 Saeki
7,778,793 B2 8/2010 Bonciolini et al.
(Continued)

FOREIGN PATENT DOCUMENTS

CN 101373728 2/2009
EP 1669808 A2 6/2007
(Continued)

OTHER PUBLICATIONS

International Search Report and Written Opinion from PCT/US2019/044755 dated Nov. 20, 2019, 13 pgs.
(Continued)

*Primary Examiner* — Giovanni Astacio-Oquendo
(74) *Attorney, Agent, or Firm* — Schwabe, Williamson & Wyatt, P.C.

(57) ABSTRACT

Embodiments disclose herein include a sensor wafer. In an embodiment, the sensor wafer comprises a substrate, wherein the substrate comprises a first surface, a second surface opposite the first surface, and an edge surface between the first surface and the second surface. In an embodiment, the sensor wafer further comprises a plurality of sensor regions formed along the first surface, wherein the sensor regions comprise self-referencing capacitive sensors. In an embodiment, the sensor wafer further comprises a vibration sensor embedded within the substrate.

20 Claims, 7 Drawing Sheets

(51) Int. Cl.
*G01H 1/00* (2006.01)
*H01L 21/687* (2006.01)

(58) Field of Classification Search
CPC ..... H01L 22/12; H01L 21/67242; G01D 5/24; G01H 1/00; G01C 9/06; G01B 17/00
USPC ............................... 324/663, 658, 649, 600
See application file for complete search history.

(56) References Cited

U.S. PATENT DOCUMENTS

| | | | |
|---|---|---|---|
| 7,804,306 | B2 | 9/2010 | Gardner et al. |
| 9,903,739 | B2 | 2/2018 | Sugita et al. |
| 10,777,445 | B2 * | 9/2020 | Nishiwaki ......... H01L 21/67754 |
| 11,094,556 | B2 * | 8/2021 | Yeh ................... H01L 21/68764 |
| 2007/0046284 | A1 | 3/2007 | Renken et al. |
| 2007/0222462 | A1 | 9/2007 | Gardner et al. |
| 2008/0231291 | A1 | 9/2008 | Ramsey et al. |
| 2008/0246493 | A1 | 10/2008 | Gardner |
| 2011/0074341 | A1 | 3/2011 | Jensen et al. |
| 2011/0132873 | A1 | 6/2011 | Tsujimoto et al. |
| 2011/0193573 | A1 | 8/2011 | De Boer et al. |
| 2012/0304928 | A1 | 12/2012 | Koelmel et al. |
| 2013/0029433 | A1 | 1/2013 | Sun et al. |
| 2016/0141154 | A1 | 5/2016 | Kamata et al. |
| 2016/0211166 | A1 | 7/2016 | Yan et al. |
| 2016/0220172 | A1 | 8/2016 | Sarrafzadeh et al. |
| 2016/0363433 | A1 | 12/2016 | Sugita et al. |
| 2017/0032987 | A1 | 2/2017 | Lee et al. |
| 2017/0131217 | A1 | 5/2017 | Tedeschi et al. |
| 2018/0114681 | A1 | 4/2018 | Jensen et al. |
| 2018/0240694 | A1 | 8/2018 | Adderly et al. |
| 2021/0031331 | A1 * | 2/2021 | Trojan .............. H01L 21/67259 |

FOREIGN PATENT DOCUMENTS

| | | |
|---|---|---|
| JP | 4956328 B2 | 6/2012 |
| JP | 2017003557 A | 1/2017 |
| JP | 2017-228754 | 12/2017 |
| KR | 1020170014384 A | 2/2017 |
| KR | 101841607 B1 | 3/2018 |
| TW | 201803004 | 1/2018 |

OTHER PUBLICATIONS

International Search Report and Written Opinion from PCT/US2019/047535 dated Dec. 10, 2019, 10 pgs.
International Search Report and Written Opinion from PCT/US2019/047752 dated Dec. 10, 2019, 12 pgs.
International Search Report and Written Opinion from PCT/US2019/047983 dated Dec. 13, 2019, 12 pgs.
Official Letter from Taiwan Patent Application No. 108130575 dated Aug. 10, 2020, 5 pgs.
International Search Report and the Written Opinion from PCT/US2019/044524 dated Dec. 20, 2019, 10 pgs.
International Preliminary Report on Patentability from Patent Application No. PCT/US2019/047535 dated Mar. 18, 2021, 6 pgs.

* cited by examiner

METHOD AND APPARATUS FOR MEASURING WAFER MOVEMENT AND PLACEMENT USING VIBRATION DATA

CROSS REFERENCE TO RELATED APPLICATIONS

This application claims priority to U.S. Provisional Application No. 62/726,874, filed on Sep. 4, 2018, the entire contents of which are hereby incorporated by reference herein.

BACKGROUND

1) Field

Embodiments relate to the field of semiconductor manufacturing and, in particular, to methods and apparatuses for measuring vibration induced displacement of a sensor wafer.

2) Description of Related Art

In semiconductor manufacturing, process uniformity over an entire substrate is critical to provide high yields. Accordingly, accurate placement of the substrate on a support surface is needed in order to provide uniform processing. In some processing tools lift pins are used to raise and lower a substrate off of the support surface (e.g., an electrostatic chuck (ESC)). However, the lift pins may be a source of displacement of the substrate in the X-Y direction. As such, raising and lowering the substrate with the lift pins may induce movement of the substrate that results in the substrate not being centered with the support surface.

Vibrations of the lift pins may be generated by the lift pins not being aligned properly. Additionally, each of the plurality of lift pins may be displaced at different rates. In such instances, the top surface of the lift pins (that support the substrate) may not always be coplanar with each other, resulting in a tilted substrate that may also contribute to undesirable wafer displacement. Currently, there are no sensors that can properly correlate lift pin vibration to substrate displacement. While vibration sensors may be used to measure vibrations from the lift pins, currently there is no feedback to identify when the vibration is sufficient to cause wafer movement on the lift pins.

SUMMARY

Embodiments disclose herein include a sensor wafer. In an embodiment, the sensor wafer comprises a substrate, wherein the substrate comprises a first surface, a second surface opposite the first surface, and an edge surface between the first surface and the second surface. In an embodiment, the sensor wafer further comprises a plurality of sensor regions formed along the first surface, wherein the sensor regions comprise self-referencing capacitive sensors. In an embodiment, the sensor wafer further comprises a vibration sensor embedded within the substrate.

Embodiments disclosed herein comprise a method of measuring vibration induced movement of a wafer in a processing tool. In an embodiment, the method comprises placing a sensor wafer with a vibration sensor and a plurality of position sensors onto a support surface in the processing tool. In an embodiment, the method further comprises determining a first position of the sensor wafer relative to the support surface with the plurality of position sensors. In an embodiment, the method further comprises lifting and lowering the sensor wafer with lift pins of the support surface while measuring the vibration of the sensor wafer with the vibration sensor. In an embodiment, the method further comprises determining a second position of the sensor wafer relative to the support surface with the plurality of position sensors.

Embodiments disclosed herein comprise a computing system for detecting vibration induced movement in a processing tool. In an embodiment, the computing system further comprises a placement controller, wherein the placement controller is communicatively coupled with a sensor wafer supported by a support surface in the processing tool and a lift pin controller that controls the displacement of lift pins in the support surface that raise and lower the sensor wafer. In an embodiment, the placement controller comprises a sensor interface, wherein the sensor interface is communicatively coupled to the sensor wafer and receives data generated by a position sensor and a vibration sensor of the sensor wafer. In an embodiment, the placement controller further comprises a wafer center-point module for determining a center-point of the sensor wafer relative to a center point of the support surface from data generated by the position sensor. In an embodiment, the placement controller further comprises a vibration module for characterizing the amount of vibration of the sensor wafer as the sensor wafer is displaced by the lift pins.

DETAILED DESCRIPTION

Systems that include sensor wafers with a vibration sensor and a position sensor and methods of using such sensor wafers to determine whether vibrations induce displacement of the sensor wafer are described in accordance with various embodiments. In the following description, numerous specific details are set forth in order to provide a thorough understanding of embodiments. It will be apparent to one skilled in the art that embodiments may be practiced without these specific details. In other instances, well-known aspects are not described in detail in order to not unnecessarily obscure embodiments. Furthermore, it is to be understood that the various embodiments shown in the accompanying drawings are illustrative representations and are not necessarily drawn to scale.

As noted above, lift pin vibration may result in undesirable movement of a wafer. Accordingly, embodiments disclosed herein provide a sensor wafer that comprises a plurality of sensors for determining the relationship between lift pin vibration and position. Such embodiments are particularly beneficial because the vibration of lift pins may be detected, and the direct effect of the lift pin vibration on wafer position may be determined. Since lift pin vibration is typically always going to be present, embodiments disclosed herein now provide a metric for determining when the vibration will exceed a predetermined threshold and result in wafer displacement. In an embodiment, the test of lift pin vibration may be implemented immediately after lift pin maintenance, eliminating the risk of processing wafers that are misaligned. Additionally, additional steps needed to verify wafer position are not needed to maintain chamber performance after process chemistries are run in the chamber.

Figure 1A:
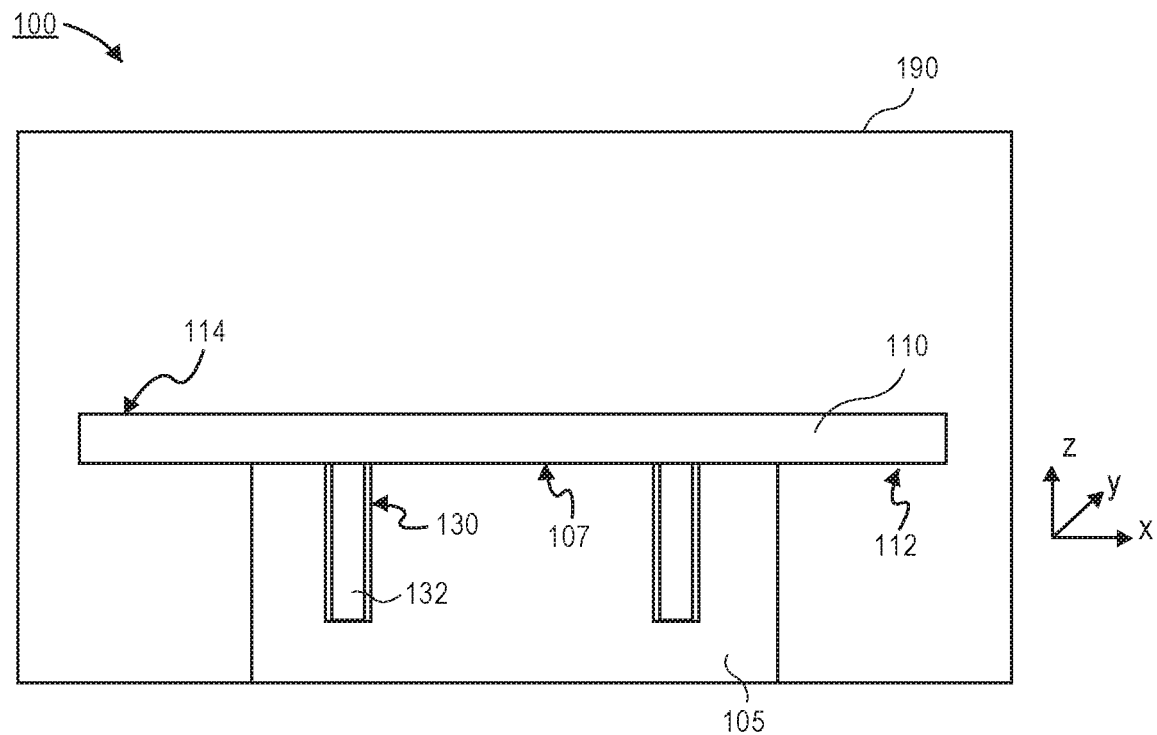
FIG. 1A is a cross-sectional schematic illustration of a processing tool with a sensor wafer for measuring vibrations and position of the sensor wafer, in accordance with an embodiment.

Referring now to FIG. 1A, a cross-sectional schematic of a processing tool 100 is shown in accordance with an embodiment. In an embodiment, the processing tool 100 may comprise a chamber 190. For example, the chamber 190 may be a vacuum chamber that is capable of providing a sub-atmospheric chamber pressure. An exhaust and vacuum pump (not shown) may be fluidically coupled to the chamber 190 to provide the vacuum conditions within the chamber 190.

In an embodiment, a support surface 105 may be located in the chamber 190. The support surface 105 may be any suitable surface for supporting and securing a wafer (or other substrate). For example, the support surface 105 may be an electrostatic chuck (ESC) or the like. In an embodiment, a plurality of lift pins 132 may be coupled to the support surface 105. The lift pins 132 may be housed in a recesses 130 in the support surface 105. In an embodiment, the lift pins 132 may be displaceable in the Z-direction. The lift pins 132 may be displaced with one or more actuators (not shown) in the support surface 105.

In the illustrated cross-section in FIG. 1A, two lift pins 132 are shown. However, it is to be appreciated that any number of lift pins 132 may be used in accordance with various embodiments. For example, the process tool 100 may comprise three lift pins 132, four lift pins 132, or more than four lift pins 132. The lift pins 132 may be distributed across the support surface in any configuration.

While several particular components of the processing tool 100 are explicitly shown, it is to be appreciated that any number of additional components common to processing tools in the semiconductor manufacturing field may also be included in the processing tool 100, as those skilled in the art will recognize. In an embodiment, the processing tool 100 may be a plasma processing tool (e.g., a plasma etch tool, a physical vapor deposition (PVD) tool, a plasma enhanced chemical vapor deposition (PE-CVD) tool, a plasma enhanced atomic layer deposition (PE-ALD) tool, or the like). Embodiments may also include processing tools 100 that are not plasma based tools (e.g., CVD, ALD, furnaces, etc.).

In accordance with an embodiment, a sensor wafer 110 may be placed into the processing tool 100 in order to measure vibration and displacement of the sensor wafer induced by the vibration of the lift pins 132. In an embodiment, the sensor wafer 110 may comprise a first surface 112 and a second surface 114 opposite from the first surface. In an embodiment, the first surface 112 may rest on a surface 107 of the support surface 105. In an embodiment, the sensor wafer 110 may have a form-factor that is substantially similar to the form-factor of substrates that are to be processed in processing tool 100. For example, the sensor wafer 110 may have a diameter that is approximately 300 mm. As will be described in greater detail below, the sensor wafer 110 may comprise a plurality of sensors (not shown in FIG. 1A). In an embodiment, the sensor wafer 110 may comprise one or more of a vibration sensor, an inclinometer sensor, and a position sensor.

Figure 1B:
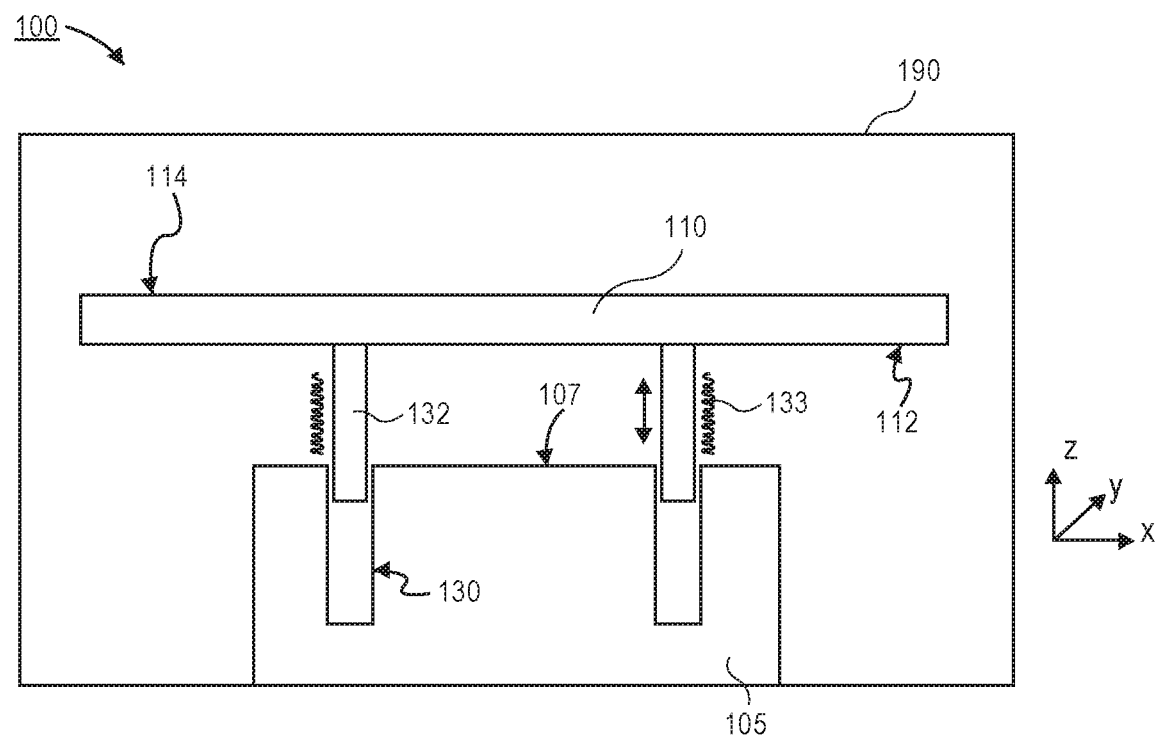
FIG. 1B is a cross-sectional schematic illustration of a processing tool with a sensor wafer supported by lift pins that are extended out from a support surface, in accordance with an embodiment.

Referring now to FIG. 1B, a cross-sectional schematic of the processing tool 100 is shown with the lift pins 132 in an extended position. As shown by the arrows, the lift pins 132 may be extended up and down in the Z-direction. In an embodiment, the extension and retraction of the lift pins 132 may result in vibrations 133. The vibrations 133 may be the result of misaligned lift pins 132. That is, the lift pins 132 may be misaligned with the recesses 130. Vibrations 133 may also be generated in the lift pins by any other mechanism. For example, the vibrations 133 may be generated by the actuators (not shown) used to displace the lift pins 132.

In an embodiment, the vibrations 133 of the lift pins 132 may be transferred to the sensor wafer 110 since the first surface 112 of the sensor wafer 110 rests on the surface of the lift pins 132 when the lift pins 132 are extended. The vibration transferred to the sensor wafer 110 may result in displacement of the sensor wafer in the X-Y plane.

Figure 1C:
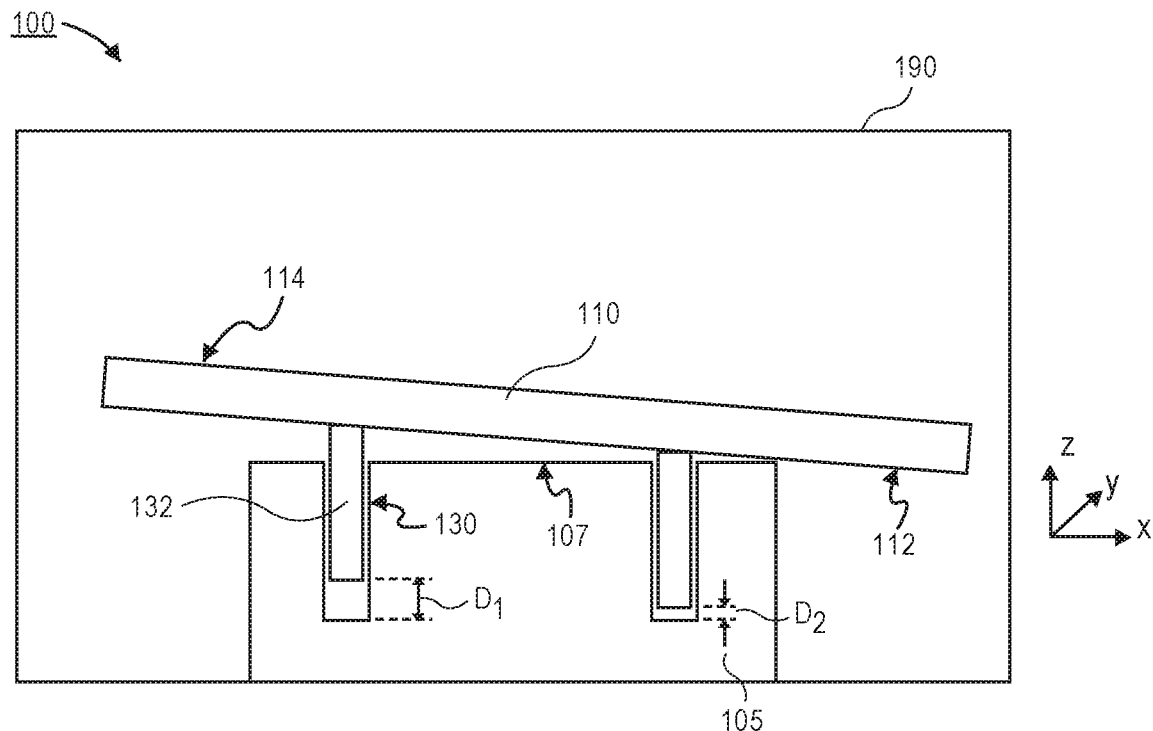
FIG. 1C is a cross-sectional schematic illustration of a processing tool with a sensor wafer supported by lift pins that are not uniformly extended, resulting in inclination of the sensor wafer, in accordance with an embodiment.

Referring now to FIG. 1C, a cross-sectional schematic of a processing tool 100 with non-coplanar lift pins 132 is shown, in accordance with an embodiment. For example a first lift pin 132 may have been displaced a first distance $D_1$ while a second lift pin 132 may have been displaced a second distance $D_2$ that is less than the first distance $D_1$. Lift pins 132 may have non-coplanar surfaces for any number of reasons. For example, the actuators for each lift pin 132 may not start at the same time, or the actuators may not advance each lift pin 132 at the same rate. In such instances, the sensor wafer 110 may tilt. In some embodiments, the tilt (also referred to as inclination) may be measured by an inclinometer sensor in the sensor wafer 110. The inclination direction (e.g., pitch and roll) may determine what direction (in the X-Y plane) the sensor wafer 110 is displaced. As such, the inclusion of inclination information in addition to vibration information may be used to more accurately track (or predict) the movement of the sensor wafer 110.

Figure 1D:
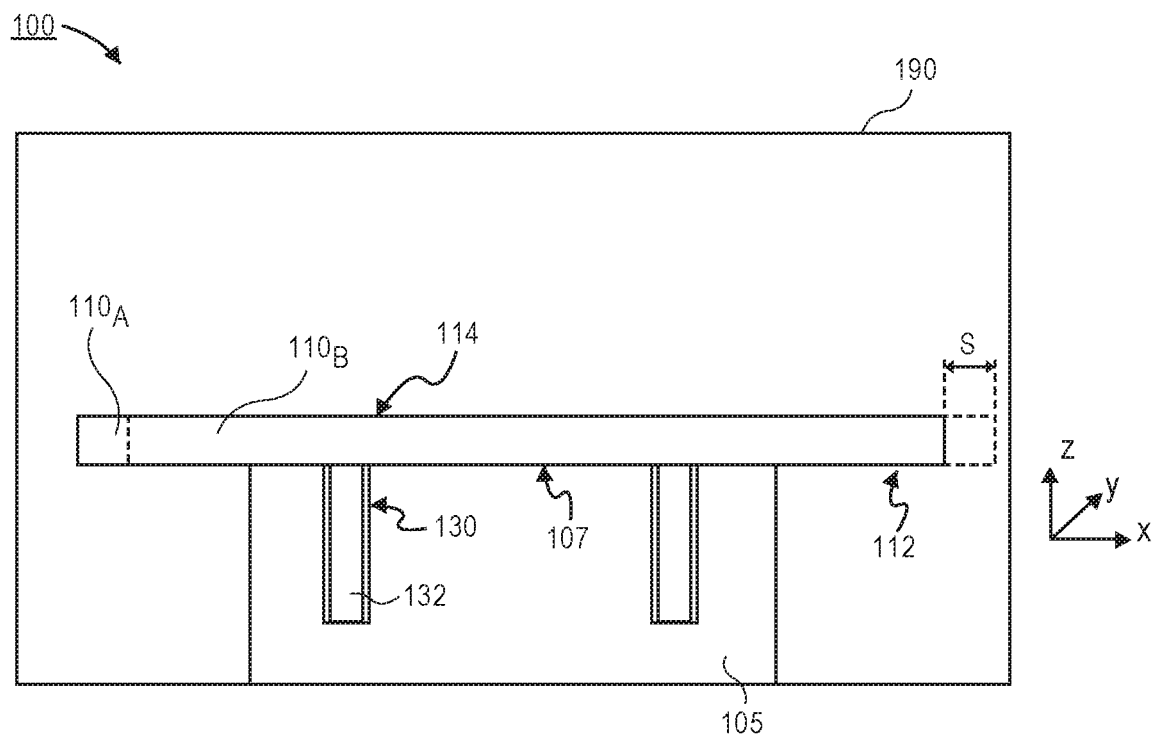
FIG. 1D is a cross-sectional schematic illustration of a processing tool with a sensor wafer and an outline of a displaced sensor wafer after raising and lowering lift pins, in accordance with an embodiment.

Referring now to FIG. 1D, a cross-sectional illustration of a processing tool 100 with a sensor wafer 110 in a first position (i.e., sensor wafer $110_A$) and the same sensor wafer 110 in a second position (i.e., sensor wafer $110_B$ indicated with dashed lines). As shown, the position of the sensor wafer 110 may have shifted in the X-Y plane a distance S. For example, the sensor wafer 110 may have shifted the distance S due to vibration or inclination of the lift pins 132 during lifting or lowering the sensor wafer 110 in the Z-direction.

In an embodiment, the sensor wafer 110 may have a plurality of sensors that correlate the vibration and inclination to the position displacement of the sensor wafer 110 with respect to the support surface 105. As such, it can be determined if the vibrations or inclination of the lift pins 132 result in displacement of the sensor wafer 110 in the X-Y plane. When movement of the sensor wafer 110 in the X-Y plane is detected, the lift pins 132 may be adjusted in order to reduce vibrations or inclination. Additional embodiments may include storing the vibration information and/or inclination information in a database that may be used in the future as a threshold value. When a threshold value is stored, subsequent testing may only require a vibration sensor and/or an inclination sensor in order to determine if movement occurs (i.e., if the vibration information and/or inclination information is greater than the threshold value, then it is expected that the wafer moves in the X-Y plane). In embodiments with an inclination sensor, the direction of the movement of the wafer may also be accurately predicted.

Figure 2A:
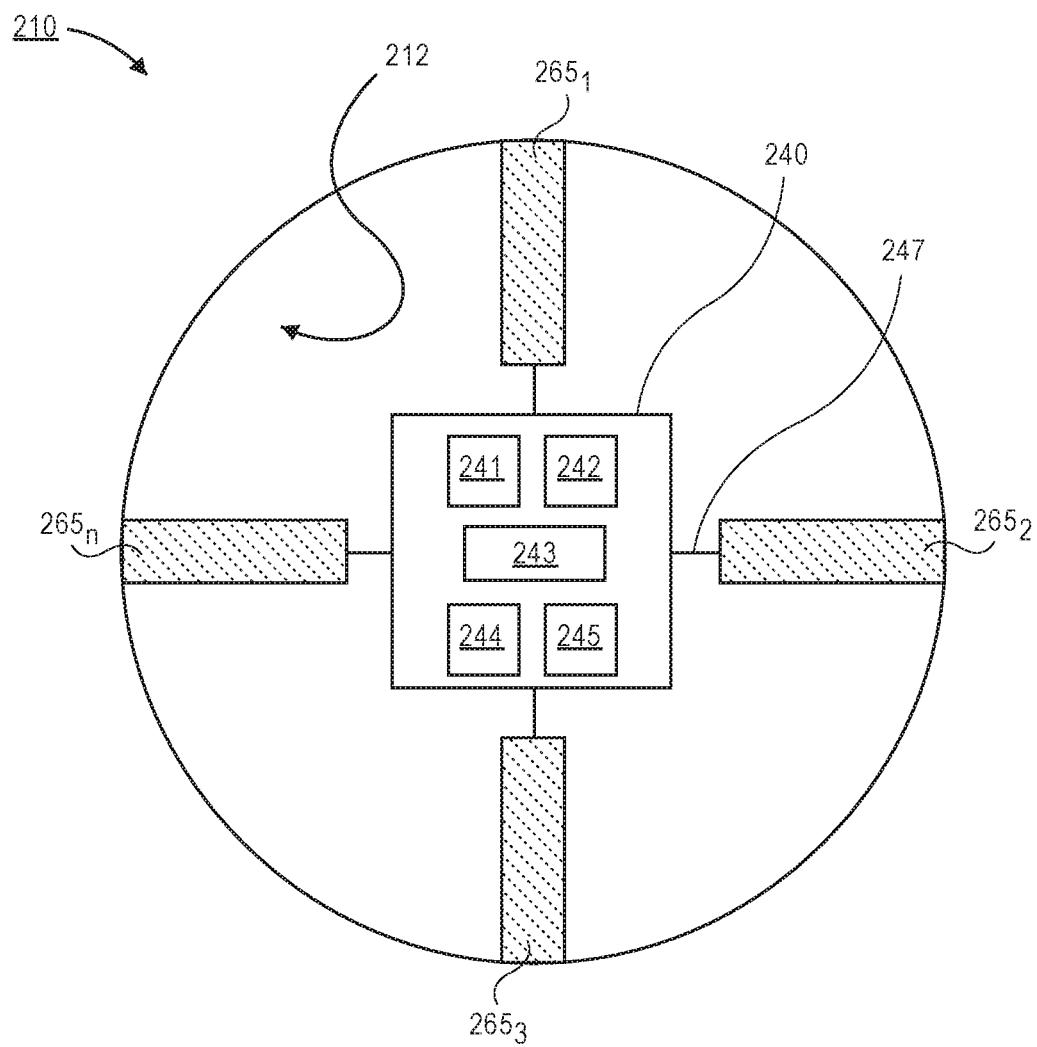
FIG. 2A is a plan view illustration of a bottom surface of a sensor wafer with sensor regions for measuring the position of the sensor wafer relative to a center of a support surface, in accordance with an embodiment.

Referring now to FIG. 2A, a plan view illustration of the first surface 212 of a sensor wafer 210 is shown, in accordance with an embodiment. As shown, the first surface 212 of the sensor wafer 210 may comprise a plurality of sensor regions $265_1$-$265_n$. In an embodiment, the sensor regions $265_{1-n}$ may each comprise a plurality of sensors (e.g., capacitive sensors) that are configured to detect the edge of the support surface. By locating the edge of the support surface at a plurality of locations (e.g., three or more locations) with respect to the sensor wafer 210, the center-point of the support surface relative to the center-point of the sensor wafer 210 may be determined. In an embodiment, the sensor regions 265 may be linear groupings of capacitive sensors. In each sensor region 265, the capacitive sensors may extend from a central portion of the sensor wafer and out to the edge of the sensor wafer 210.

In an embodiment, sensor wafer 210 may comprise a computing module 240 that houses one or more of a power supply 241, a processor/memory 242, a wireless communication module 243, a vibration sensor 244, and an inclinometer 245. The computing module 240 may be communicatively coupled to the bottom sensor regions 265 by conductive traces 247. In an embodiment, the vibration sensor 244 may be an accelerometer. In an embodiment, the accelerometer may be configured to detect vibration only in the X, Y, and Z directions. In an embodiment, the sensor wafer 210 may comprise a plurality of vibration sensors.

In an embodiment, the computing module 240 may include circuitry for supplying current to the sensors of the sensor regions $265_{1-n}$. In an embodiment, the plurality of sensors may include a plurality of pairs of self-referencing capacitive sensors. In an embodiment, current delivered to the first conductive pad in each pair may have an output phase that is 180 degrees offset from an output phase of current delivered to the second conductive pad in each pair.

In the illustrated embodiment, the computing module 240 is located in the approximate center of the sensor wafer 210. However, it is to be appreciated that the computing module 240 may be located in any convenient location of the sensor wafer 210. Furthermore, the components 241-245 may be not be co-located in a single module. For example, one or more of the components 241-245 may be located outside of the computing module 240.

Figure 2B:
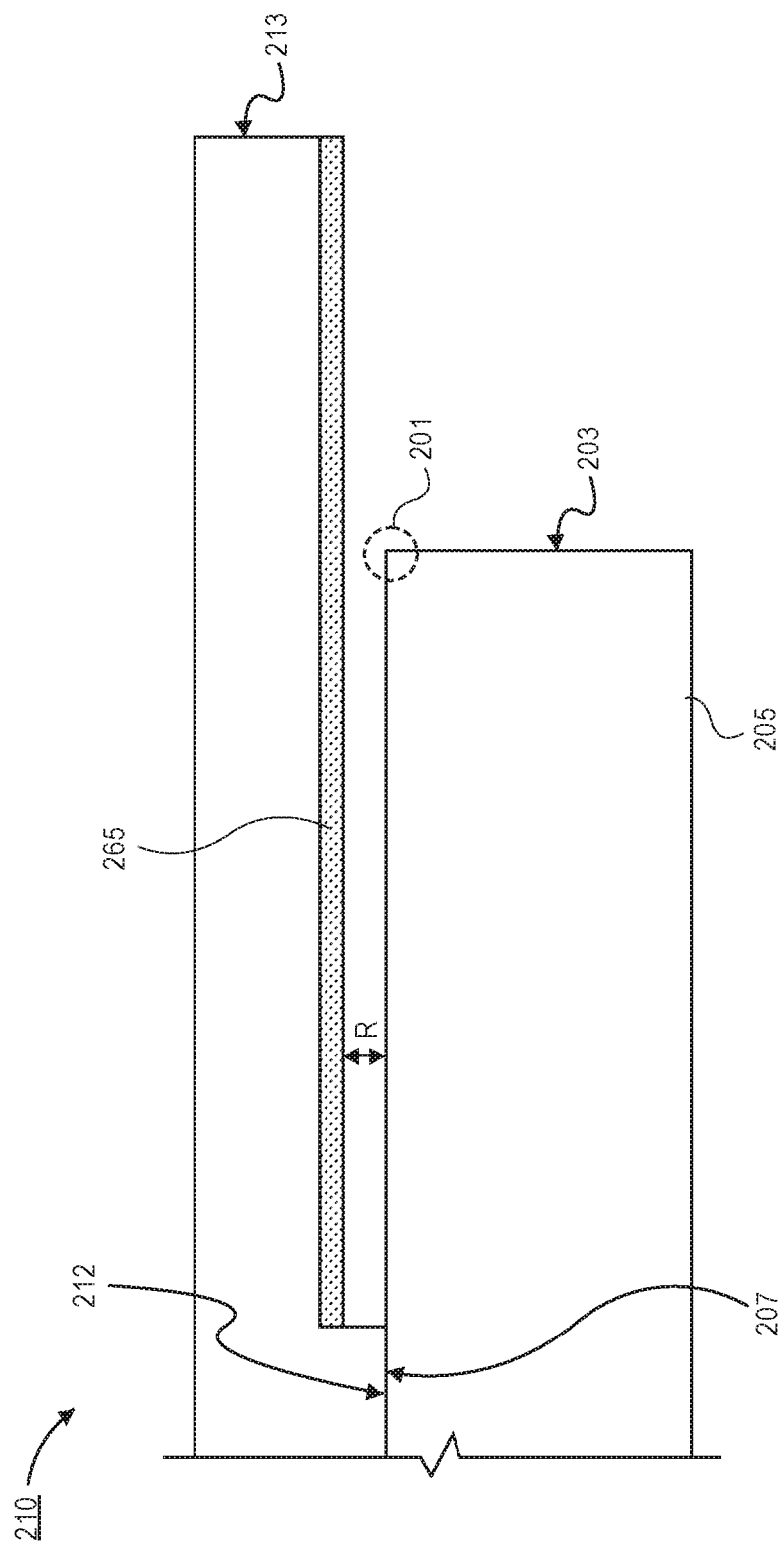
FIG. 2B is a partial cross-sectional illustration of a sensor wafer with a bottom sensor region, in accordance with an embodiment.

Referring now to FIG. 2B, a partial cross-sectional illustration of a sensor wafer 210 and a portion of the support surface 205 is shown, in accordance with an embodiment. As shown, the bottom sensor region 265 may be formed on a recessed portion of the first surface 212 that faces surface 207 of the support surface 205 and extend out to the edge 213 of the sensor wafer 210. In an embodiment, the bottom sensor region 265 may comprise an array of sensors (e.g., self-referencing capacitive sensors) that determine the spacing between the support surface 205 and the sensor region 265. Accordingly, at location 201, the array of sensors in the bottom sensor region 265 will indicate that the edge 203 of the support surface is present since there is no underlying surface detectable by the sensor region 265. The position of location 201 is known with respect to the center of the sensor wafer 210. As such, when three or more locations 201 are determined, a center-point of the support surface 205 relative to the center-point of the sensor wafer 210 can be calculated.

Figure 3:
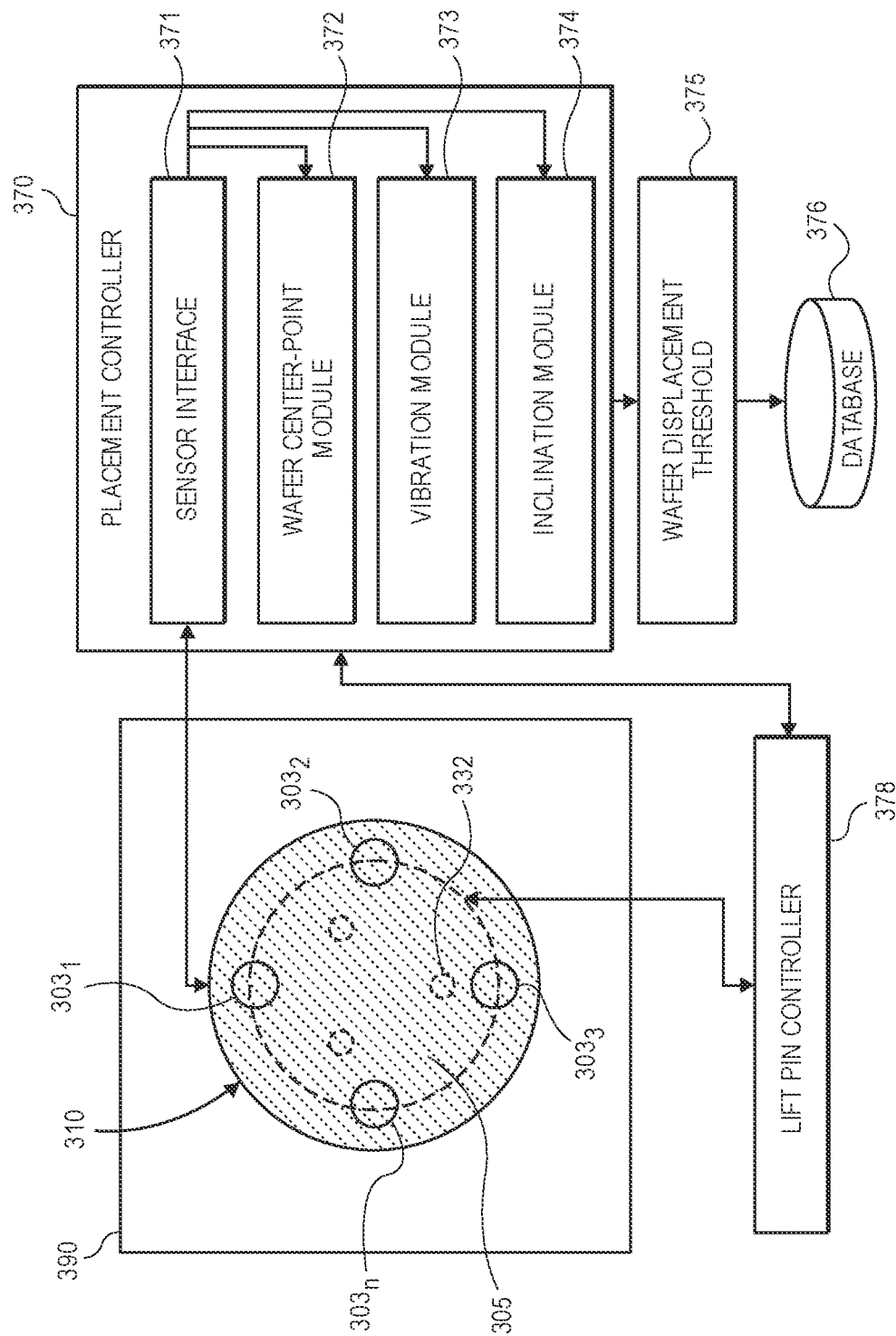
FIG. 3 is a schematic diagram of a processing tool and a placement controller for determining whether a sensor wafer is displaced by vibrations, in accordance with an embodiment.

Referring now to FIG. 3, a schematic block diagram of a processing tool 390 with a placement controller 370 for implementing a process to measure the vibration of lift pins 332 and the resulting displacement of a sensor wafer 310 is shown, in accordance with an embodiment. In an embodiment, the placement controller 370 may provide instructions to a lift pin controller 378 to raise and lower a sensor wafer 310 on the support surface 305 with lift pins 332.

The sensor wafer 310 may be a sensor wafer similar to sensor wafers described above. For example, the sensor wafer 310 may comprise a plurality of sensor regions to determine the edge locations $303_1$-$303_n$ of the support surface 305. Additionally, the sensor wafer 310 may comprise a vibration sensor (e.g., an accelerometer) and an inclination sensor.

In an embodiment, the sensor information from the sensor wafer 310 may be obtained by the sensor interface 371 of the placement controller 370. For example, the sensor interface 371 may receive sensor information from the sensor wafer 310 (e.g., wirelessly with a wireless communication module). The placement controller 370 may utilize sensor information (e.g., edge locations $303_1$-$303n$) in a wafer center-point module 372 to determine a center-point of the sensor wafer 310 relative to a center-point of the support surface 305. As will be described below, the center-point module 372 may be used a first time to find a first location of the sensor wafer 310 and a second time to find a second location of the sensor wafer after the sensor wafer 310 is raised and lowered one or more times by the lift pins 332.

In an embodiment, the placement controller 370 may also include a vibration module 373. The vibration module 373 may process vibration information obtained by the sensor interface 371 from the vibration sensor on the sensor wafer 310. In an embodiment, the vibration module 373 may analyze the vibration information to determine a total amount of vibration, the maximum vibration, or the like.

In an embodiment, the placement controller 370 may also comprise an inclination module 374. The inclination module 374 may process inclination information obtained by the sensor interface 371 from the inclination sensor on the sensor wafer 310. In an embodiment, the inclination module 374 may analyze the inclination information to determine a total amount of inclination variation throughout the lifting and lowering of the lift pins 332, the maximum inclination variation of the sensor wafer 310 during the lifting and lowering of the lift pins 332, or the like.

In an embodiment, the placement controller 370 may generate a wafer displacement threshold 375 that is stored in a database 376. In an embodiment, the wafer displacement threshold 375 may be sent to the database 376 when displacement of the sensor wafer 310 in the X-Y plane is detected by the wafer center-point module 372. In such instances, information from the vibration module 373 and/or the inclination module 374 are stored and associated with movement of the sensor wafer 310. Accordingly, future measurements of the vibration or inclination may be compared to the stored wafer displacement threshold 375. If the wafer displacement threshold is exceeded, it may be assumed that the wafer has moved.

Figure 4:
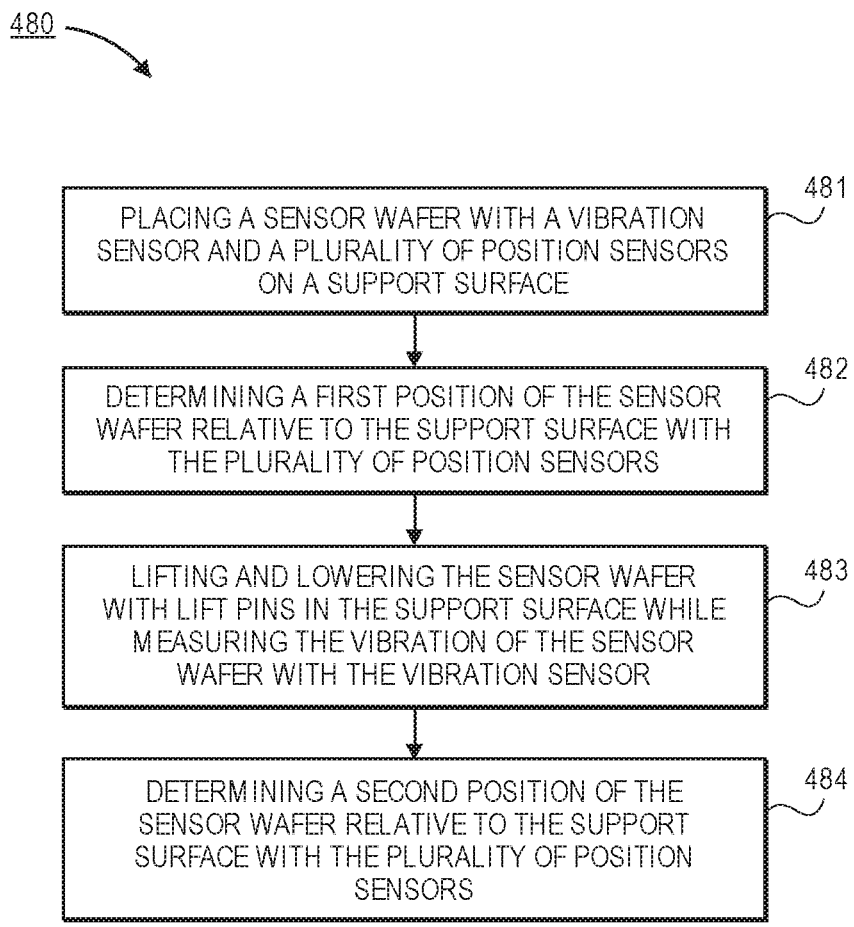
FIG. 4 is a flow diagram of a process for determining whether vibrations of lift pins are sufficient to displace a sensor wafer, in accordance with an embodiment.

Referring now to FIG. 4, a process flow diagram of a process 480 for associating vibration of lift pins with movement of a wafer is shown, in accordance with an embodiment. In an embodiment, process 480 may begin with operation 481 which comprises placing a sensor wafer with a vibration sensor and a plurality of position sensors on a support surface. In an embodiment, the sensor wafer may be any sensor wafer such as those described herein. In an embodiment, the sensor wafer may further comprise an inclination sensor.

In an embodiment, process 480 may continue with operation 482 which comprises determining a first position of the sensor wafer relative to the support surface with the plurality of position sensors. In an embodiment, the plurality of position sensors may determine the first position by detecting the edge of the support surface at a plurality of locations. Since the center-point of the sensor wafer is known with respect to the position of the sensors, the plurality of edge locations may be used to calculate a center-point of the sensor wafer relative to a center-point of the support surface.

In an embodiment, process 480 may continue with operation 483 which comprises lifting and lowering the sensor wafer with lift pins in the support surface while measuring the vibration of the sensor wafer with the vibration sensor. In an embodiment, the sensor wafer may be lifted and lowered one or more times. For example, the sensor wafer may be lifted and lowered five or more times. In embodiments that include an inclinometer sensor, the inclination of the sensor wafer may also be measured during the lifting and lowering of the sensor wafer.

In an embodiment, process 480 may continue with operation 484 which comprises determining a second position of the sensor wafer relative to the support surface with the plurality of position sensors. In an embodiment, the second position may be determined with substantially the same process used to determine the first position. For example, the plurality of position sensors may detect a plurality of support surface edge locations in order to determine a center-point of the sensor wafer relative to a center point of support surface. In an embodiment, the second position may be determined after a single iteration of raising and lowering the lift pins. In additional embodiments, the second position may be determined after a plurality of iterations of raising and lowering the lift pins.

In an embodiment, the second position may be compared to the first position to see if the sensor wafer has moved. If the sensor wafer has moved, then it may be assumed that vibration and/or inclination of the lift pins has caused the movement of the sensor wafer. In such instances, a wafer displacement threshold that comprises information from the vibration sensor and/or the inclination sensor may be stored in a database for future reference. In embodiments where the lift pins have been shown to displace the sensor wafer in the X-Y plane, it may be necessary to adjust or otherwise modify the lift pins. Since this measurement is made prior to processing substrates in the processing tool, the risk of processing wafers that are misaligned is eliminated.

Figure 5:
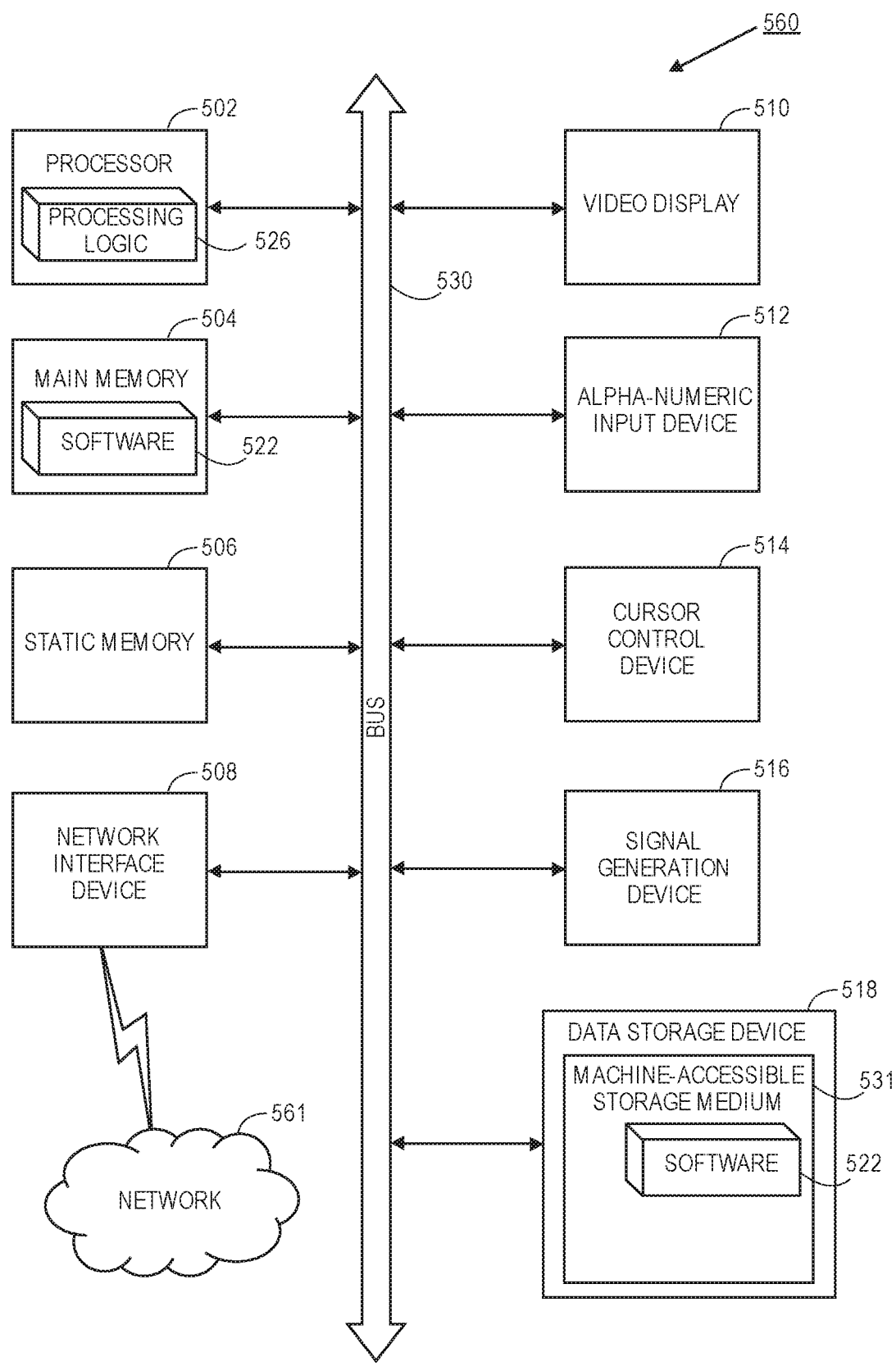
FIG. 5 illustrates a block diagram of an exemplary computer system that may be used in conjunction with processes that include determining whether vibrations of lift pins are sufficient to displace a sensor wafer, in accordance with an embodiment.

Referring now to FIG. 5, a block diagram of an exemplary computer system 560 of a processing tool is illustrated in accordance with an embodiment. In an embodiment, the computer system 560 may be used as the placement controller. In an embodiment, computer system 560 is coupled to and controls processing in the processing tool. Computer system 560 may be connected (e.g., networked) to other machines in a network 561 (e.g., a Local Area Network (LAN), an intranet, an extranet, or the Internet). Computer system 560 may operate in the capacity of a server or a client machine in a client-server network environment, or as a peer machine in a peer-to-peer (or distributed) network environment. Computer system 560 may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated for computer system 560, the term "machine" shall also be taken to include any collection of machines (e.g., computers) that individually or jointly execute a set (or multiple sets) of instructions to perform any one or more of the methodologies described herein.

Computer system 560 may include a computer program product, or software 522, having a non-transitory machine-readable medium having stored thereon instructions, which may be used to program computer system 560 (or other electronic devices) to perform a process according to embodiments. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

In an embodiment, computer system 560 includes a system processor 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a secondary memory 518 (e.g., a data storage device), which communicate with each other via a bus 530.

System processor 502 represents one or more general-purpose processing devices such as a microsystem processor, central processing unit, or the like. More particularly, the system processor may be a complex instruction set computing (CISC) microsystem processor, reduced instruction set computing (RISC) microsystem processor, very long instruction word (VLIW) microsystem processor, a system processor implementing other instruction sets, or system processors implementing a combination of instruction sets. System processor 502 may also be one or more special-purpose processing devices such as an application specific integrated circuit (ASIC), a field programmable gate array (FPGA), a digital signal system processor (DSP), network system processor, or the like. System processor 502 is configured to execute the processing logic 526 for performing the operations described herein.

The computer system 560 may further include a system network interface device 508 for communicating with other devices or machines. The computer system 560 may also include a video display unit 510 (e.g., a liquid crystal display (LCD), a light emitting diode display (LED), or a cathode ray tube (CRT)), an alphanumeric input device 512 (e.g., a keyboard), a cursor control device 514 (e.g., a mouse), and a signal generation device 516 (e.g., a speaker).

The secondary memory 518 may include a machine-accessible storage medium 531 (or more specifically a computer-readable storage medium) on which is stored one or more sets of instructions (e.g., software 522) embodying any one or more of the methodologies or functions described herein. The software 522 may also reside, completely or at least partially, within the main memory 504 and/or within the system processor 502 during execution thereof by the computer system 560, the main memory 504 and the system processor 502 also constituting machine-readable storage media. The software 522 may further be transmitted or received over a network 561 via the system network interface device 508.

While the machine-accessible storage medium 531 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies. The term "machine-readable storage medium" shall accordingly be taken to include, but not be limited to, solid-state memories, and optical and magnetic media.

In the foregoing specification, specific exemplary embodiments have been described. It will be evident that various modifications may be made thereto without departing from the scope of the following claims. The specification and drawings are, accordingly, to be regarded in an illustrative sense rather than a restrictive sense.

What is claimed is:

1. A sensor wafer, comprising:
   a substrate, wherein the substrate comprises a first surface, a second surface opposite the first surface, and an edge surface between the first surface and the second surface;
   a plurality of sensor regions formed along the first surface, wherein the sensor regions comprise self-referencing capacitive sensors; and
   a vibration sensor embedded within the substrate.

2. The sensor wafer of claim 1, wherein each of the plurality of sensor regions extend radially out to the edge surface of the substrate.

3. The sensor wafer of claim 2, wherein surfaces of the sensor regions are recessed from the second surface.

4. The sensor wafer of claim 1, further comprising:
   an inclinometer sensor embedded in the substrate.

5. The sensor wafer of claim 1, wherein the sensor regions are for detecting an edge of a support surface that supports the sensor wafer.

6. The sensor wafer of claim 1, wherein the vibration sensor measures vibrations of the sensor wafer as it is lifted and/or lowered by pins in a processing chamber.

7. The sensor wafer of claim 1, wherein the vibration sensor comprises an accelerometer.

8. The sensor wafer of claim 7, wherein the accelerometer senses acceleration along a plane substantially parallel to the first surface.

9. The sensor wafer of claim 1, wherein a diameter of the sensor wafer is 300 mm.

10. A method of measuring vibration induced movement in a processing tool, comprising:
    placing a sensor wafer with a vibration sensor and a plurality of position sensors onto a support surface in the processing tool;
    determining a first position of the sensor wafer relative to the support surface with the plurality of position sensors;
    lifting and lowering the sensor wafer with lift pins of the support surface while measuring vibration of the sensor wafer with the vibration sensor; and
    determining a second position of the sensor wafer relative to the support surface with the plurality of position sensors.

11. The method of claim 10, wherein the second position is determined after lifting and lowering the sensor wafer a plurality of times with the lift pins of the support surface.

12. The method of claim 11, wherein the plurality of times is at least five iterations of lifting and lowering.

13. The method of claim 10, further comprising:
    comparing the first position to the second position.

14. The method of claim 13, further comprising:
    storing vibration information from the vibration sensor in a database.

15. The method of claim 14, wherein vibration information comprises one or more of a maximum acceleration, a cumulative acceleration.

16. The method of claim 10, wherein the vibration sensor is an accelerometer.

17. The method of claim 16, wherein the accelerometer senses acceleration in a plane orthogonal to a direction of lifting and lowering of the sensor wafer.

18. A computing system for detecting vibration induced movement in a processing tool, comprising:
    a placement controller, wherein the placement controller is communicatively coupled with a sensor wafer supported by a support surface in the processing tool and a lift pin controller that controls a displacement of lift pins in the support surface that raise and lower the sensor wafer, the placement controller comprising:
        a sensor interface, wherein the sensor interface is communicatively coupled to the sensor wafer and receives data generated by a position sensor and a vibration sensor of the sensor wafer;
        a wafer center-point module for determining a center-point of the sensor wafer relative to a center point of the support surface from data generated by the position sensor; and
        a vibration module for characterizing an amount of vibration of the sensor wafer as the sensor wafer is displaced by the lift pins.

19. The computing system of claim 18, wherein the wafer center-point module compares a first position of the sensor wafer with a second position of the sensor wafer after the sensor wafer has been lifted and lowered with the lift pins, and when the first position is different than the second position, a wafer displacement threshold is generated by the placement controller and stored in a database.

20. The computing system of claim 18, further comprising:
    an inclination module for characterizing an amount of inclination of the sensor wafer as the sensor wafer is displaced by the lift pins.

* * * * *